United States Patent
Lin et al.

(10) Patent No.: US 9,543,125 B2
(45) Date of Patent: Jan. 10, 2017

(54) DIRECTING PLASMA DISTRIBUTION IN PLASMA-ENHANCED CHEMICAL VAPOR DEPOSITION

(71) Applicant: Taiwan Semiconductor Manufacturing Company Limited, Hsin-Chu (TW)

(72) Inventors: Hsiang-Wei Lin, New Taipei (TW); Chia-Ho Chen, Zhubei (TW); Bo-Hung Lin, Kaohsiung (TW)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 288 days.

(21) Appl. No.: 13/855,939

(22) Filed: Apr. 3, 2013

(65) Prior Publication Data

US 2014/0272193 A1    Sep. 18, 2014

Related U.S. Application Data

(60) Provisional application No. 61/799,264, filed on Mar. 15, 2013.

(51) Int. Cl.
*H01J 37/32* (2006.01)
*C23C 16/50* (2006.01)

(52) U.S. Cl.
CPC ......... *H01J 37/32669* (2013.01); *C23C 16/50* (2013.01); *H01J 37/32449* (2013.01); *H01J 2237/3323* (2013.01)

(58) Field of Classification Search
None
See application file for complete search history.

(56) References Cited

U.S. PATENT DOCUMENTS

2004/0182516 A1*  9/2004  Lindley ............. H01J 37/32623
                                                    156/345.46
2011/0223346 A1*  9/2011  Kitada et al. ................. 427/523

FOREIGN PATENT DOCUMENTS

| KR | 1020040028985 | 4/2004 |
| KR | 1020080002004 | 1/2008 |
| WO | 03025971 A2 | 3/2003 |

OTHER PUBLICATIONS

Periphery—definition Merriam-Webster online downloaded Feb. 2016.*

(Continued)

*Primary Examiner* — Joseph Miller, Jr.
(74) *Attorney, Agent, or Firm* — Cooper Legal Group, LLC

(57) ABSTRACT

Plasma-enhanced chemical vapor deposition (PECVD) devices enable the generation of a plasma in a plasma zone of a deposition chamber, which reacts with a surface of a substrate to form a deposited film in the fabrication of a semiconductor component. The plasma generator is often positioned over the center of the substrate, and the generated plasma often remains in the vicinity of the plasma generator, resulting in a thicker deposition near the center than at the edges of the substrate. Tighter process control is achievable by positioning one or more electromagnets in a periphery of the plasma zone and supplying power to generate a magnetic field, thereby inducing the charged plasma to achieve a more consistent distribution within the plasma zone and more uniform deposition on the substrate. Variations in the number, configuration, and powering of the electromagnets enable various redistributive effects on the plasma within the plasma zone.

20 Claims, 6 Drawing Sheets

(56) References Cited

OTHER PUBLICATIONS

English Translation of Korean Office action dated Jul. 28, 2014, 6 pages.
Korean Office action dated Jul. 28, 2014, 5 pages.
Proposed response to Office action dated Sep. 28, 2014, 3 pages.

* cited by examiner

DIRECTING PLASMA DISTRIBUTION IN PLASMA-ENHANCED CHEMICAL VAPOR DEPOSITION

BACKGROUND

The present disclosure is related to plasma-enhanced chemical vapor deposition (PECVD) techniques, wherein a substrate positioned within a chemical vapor deposition (CVD) chamber is exposed to a plasma generated from a precursor.

SUMMARY

This Summary is provided to introduce a selection of concepts in a simplified form that are further described below in the detailed description. This summary is not intended to be an extensive overview of the claimed subject matter, identify key factors or essential features of the claimed subject matter, nor is it intended to be used to limit the scope of the claimed subject matter.

In many PECVD devices, a vaporous precursor is injected into a deposition chamber through a CVD assembly, including a block plate, and a shower head surrounded by an annular pumping liner having a set of liner apertures. The precursor is exposed to a plasma generator, such as an electrode pair or a source of microwave radiation, thus converting the precursor into a charged plasma within a plasma zone of the CVD chamber. The exposure of the substrate to the plasma results in a chemical reaction and deposition on the substrate, such as in order to form a film comprising a component of a semiconductor device.

However, the exposure of the substrate to the plasma often results in uneven deposition due to the distribution of the plasma within the CVD chamber, and particularly with respect to the surface of the substrate. In particular, generated plasma often remains in the proximity of the plasma generator, which is often positioned above the center of the substrate. A higher plasma concentration nearer the center of the substrate than near the edges results in inconsistent deposition, thereby reducing deposited thickness consistency and process control.

The present disclosure relates techniques for addressing the non-uniform distribution of plasma within the plasma zone. Because plasma comprises electrically charged particles, it is possible to control the distribution of plasma by generating a magnetic field. This is achievable by positioning one or more electromagnets in a periphery of the plasma zone, such as a pair of electromagnets on opposite sides of the plasma zone, or a ring of electromagnets encircling the plasma zone. An electromagnet controller provides power to the electromagnets, optionally of varying magnitude, in order to adjust the strength of the magnetic fields generated thereby and the attraction or propulsion of plasma particles achieved thereby. As one example, positioning the electromagnets at the periphery of the plasma zone and applying power to create a magnetic field that attracts the charged plasma induces plasma movement from the center of the plasma zone toward the periphery. Adjustment of the field strength enables a more uniform distribution of plasma throughout the plasma zone, thus providing tighter process control and promoting deposition consistency.

The following description and annexed drawings set forth certain illustrative aspects and implementations. These are indicative of but a few of the various ways of embodying one or more aspects of the presented techniques. Other aspects, advantages, and novel features of the disclosure will become apparent from the following detailed description when considered in conjunction with the annexed drawings.

DESCRIPTION OF THE DRAWINGS

Aspects of the disclosure are understood from the following detailed description when read with the accompanying drawings. It will be appreciated that elements and/or structures of the drawings are not necessarily be drawn to scale. Accordingly, the dimensions of the various features is arbitrarily increased and/or reduced for clarity of discussion.

DETAILED DESCRIPTION

Figure 1:
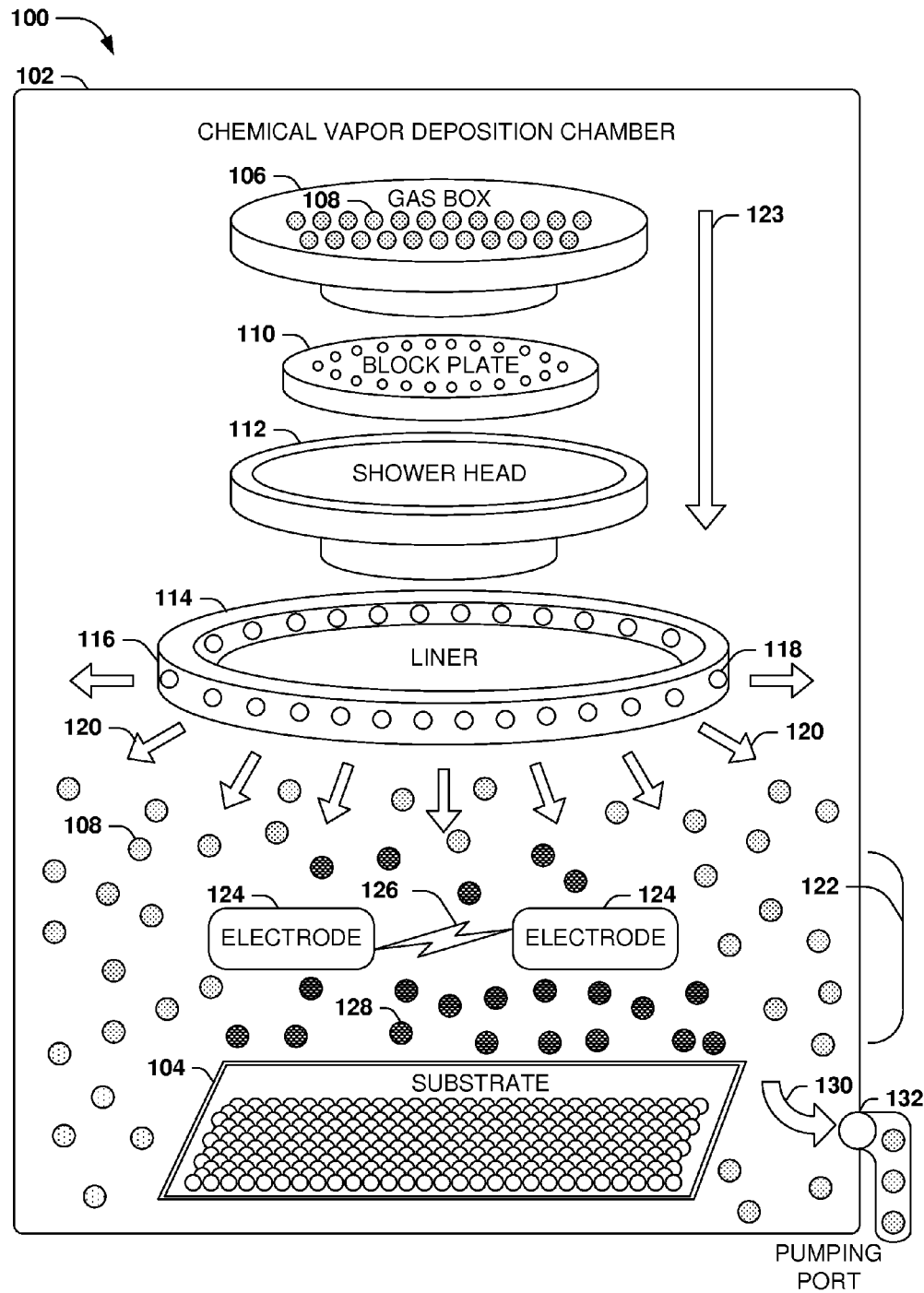
FIG. 1 is an illustration of an exemplary CVD assembly.

Embodiments or examples, illustrated in the drawings, are disclosed below using specific language. It will nevertheless be understood that the embodiments or examples are not intended to be limiting. Any alterations and modifications in the disclosed embodiments, and any further applications of the principles disclosed in this document are contemplated as would normally occur to one of ordinary skill in the pertinent art.

FIG. 1 presents an illustration of an exemplary scenario 100 featuring a CVD technique, wherein a CVD chamber 102 stores a substrate 104 that is to be exposed to a charged plasma formed from a precursor 108 in order to form a film, such as a component of a semiconductor device. Because the manner in which the precursor 108 is directed at the substrate 104 affects many properties of the resulting film, the CVD chamber 102 includes a CVD assembly to inject the precursor 108 into the CVD chamber 102 in a controlled manner. The CVD chamber 102 therefore includes an injection assembly including a gas box 106 storing the precursor 108; a block plate 110 that disperses of the precursor 108; and a shower head 112 surrounded by a pumping liner 114 comprising an array of liner apertures 118 penetrating an outer surface 116 of the pumping liner 114. When the gas box 106 injects 123 the vaporous precursor 108 through the CVD assembly, the precursor 108 emits 120 from the liner apertures 118 into the CVD chamber 102. Additionally, a pair of electrodes 124 is positioned to generate an electric current 126 that generates a plasma 128 from the precursor 108 in a plasma zone 122 within the CVD chamber 102. The plasma 128 encounters the substrate 104 and, through various physical and chemical processes, forms a deposited layer on the surface of the substrate 104. The injection of precursor 108 and the formation of plasma 128 in the plasma zone 122 occurs for a precise duration, and unreacted precursor 108 is evacuated 130 from the CVD chamber 102 via a pumping port 132. In this manner, the CVD chamber 102 achieves the deposition of a film on the surface of the substrate 104.

However, it has been observed that the PECVD technique illustrated in the exemplary scenario 100 of FIG. 1 often results in undesirable variance in the formation of a deposited film on the substrate 104 in a few respects. In particular, and as depicted in the exemplary scenario 100 of FIG. 1, the plasma 128 is formed in the vicinity of the electrodes 124, but often remains near the electrodes 124 or other plasma generator. While the electrodes 124 are often positioned to generate the plasma 128 near the center of the substrate 104, plasma exposure exhibits a gradient, and deposition at the edges of the substrate 104 is often lower than exposure at the center. The resulting gradient causes inconsistent exposure and layer formation over the surface of the substrate 104.

Figure 2:
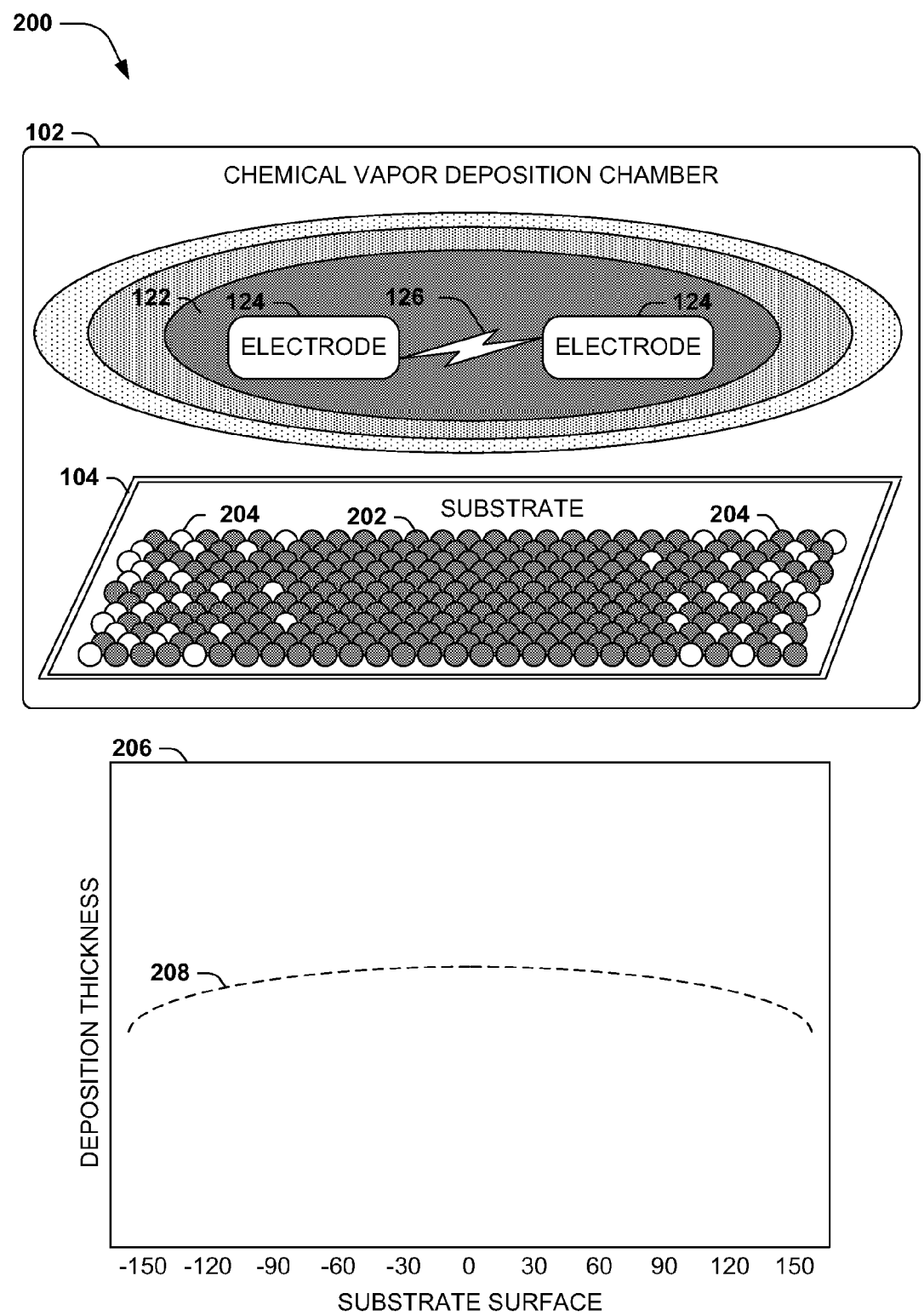
FIG. 2 is an illustration of an exemplary scenario depicting distribution of plasma within a plasma zone during deposition.

FIG. 2 presents a depiction 200 of the effects of plasma formation. In the top illustration, the formation of plasma 128 within the plasma zone 122 of the CVD chamber 102 is illustrated as a gradient that diminishes with distance from the electrodes 124. As a result, while the center 202 of the substrate is completely exposed to the plasma 128, reduced exposure causes incomplete deposition at the edges 204 of the substrate 104. The plot 206 illustrates, as one potential effect, a curve 208 illustrating a variance in the deposition thickness across the surface of the substrate 104. This variance leads to inconsistencies in the physical and electrical properties of the components formed on the substrate 104, and a loss of process control.

In view of these observations, greater consistency and reduced variance are achievable through modification of the CVD chamber 102 to achieve more uniform distribution of the plasma 128 throughout the plasma zone 122. Because plasma 128 is electrically charged, the distribution of the plasma 128 is controllable by creating a magnetic field, such as with an electromagnet. Therefore, generating a magnetic field at the periphery of the plasma zone 122, and with a polarity opposite the charge of the plasma 128, is capable of attracting the plasma 128 away from the electrodes 124. Adjusting the distribution and field strengths of the electromagnets enables a more uniform distribution of the plasma 128 throughout the plasma zone 122, resulting in more consistent exposure of the substrate 104 to the plasma 128 and reduced variance in the deposition thickness across the surface of the substrate 104.

Figure 3:
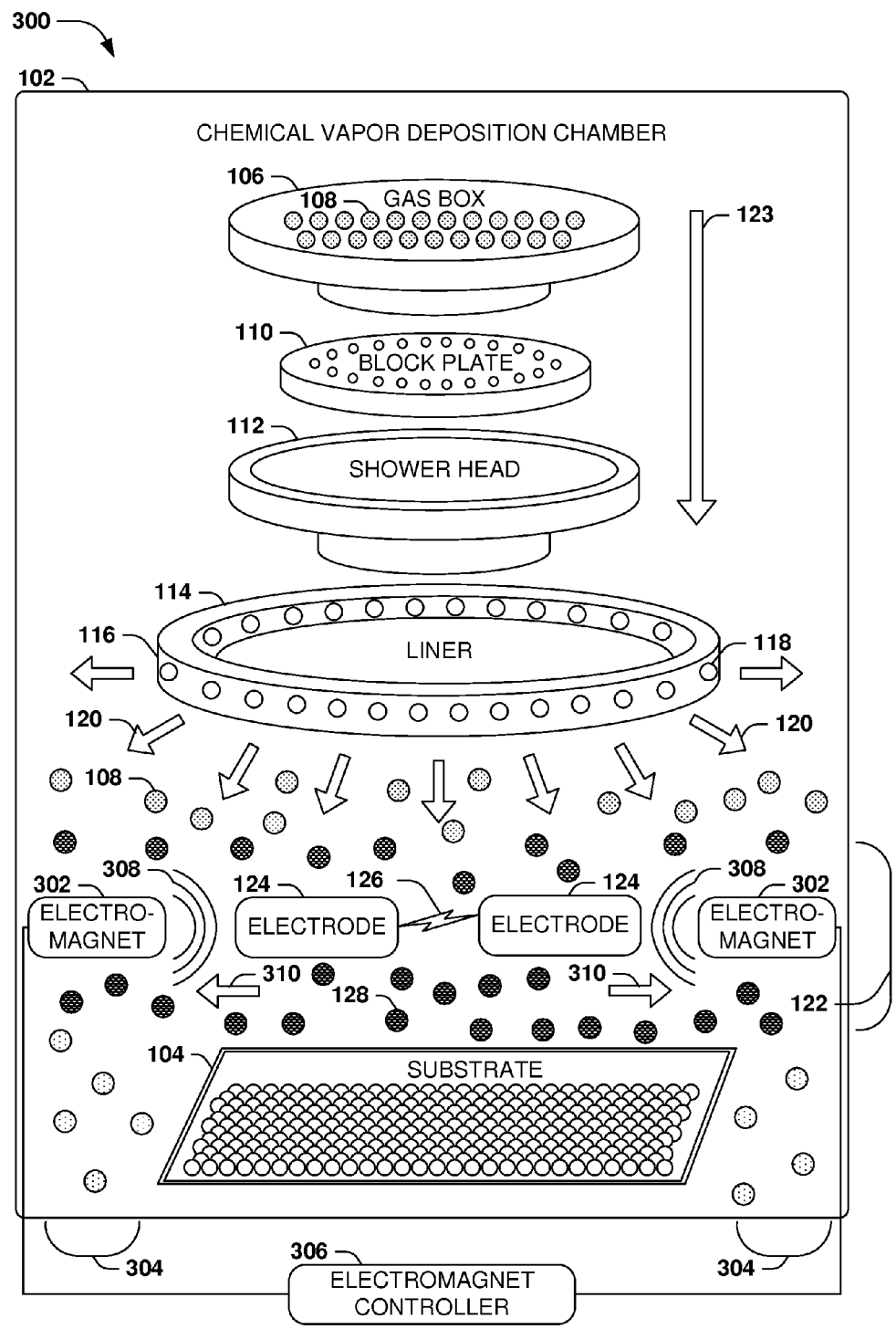
FIG. 3 is an illustration of an exemplary CVD assembly in accordance with the techniques presented herein.

FIG. 3 presents an illustration of an exemplary scenario 300 featuring a PECVD device utilizing the techniques presented herein. In this exemplary scenario 300, a CVD chamber 102 includes a gas box 106 storing the precursor 108, a block plate 110 dispersing the precursor 108, and a shower head 112 and pumping liner 114 that control the injection of the precursor 108 into the CVD chamber 102. The CVD chamber 102 also includes a pair of electrodes 124 positioned in a plasma zone 122 and generating an electric current 126 that forms a plasma 128 in the plasma zone 122. In accordance with the techniques presented herein, the CVD device also includes a pair of electromagnets 302 positioned in a periphery 304 of the plasma zone 122. The electromagnets 302 are connected to an electromagnet controller 306 that is configured to provide power controllably to the electromagnet 302, such as a variable wattage, thereby inducing each electromagnet 302 to create a controllable magnetic field 308. When generated with a polarity opposite the charge of the plasma 128, the magnetic field 308 attracts 310 the plasma 128 toward the periphery 304, thus altering the distribution of the plasma 128 within the plasma zone 122. Moreover, by carefully controlling the power provided to the electromagnets 302 and strength of the induced magnetic field 308, the electromagnet controller 306 is capable of achieving a consistent distribution of the plasma 128 throughout the plasma zone 122, thus facilitating uniform exposure of the plasma 128 to the substrate 104 and reducing the variance in the thickness of the film across the surface of the substrate 104.

Figure 4:
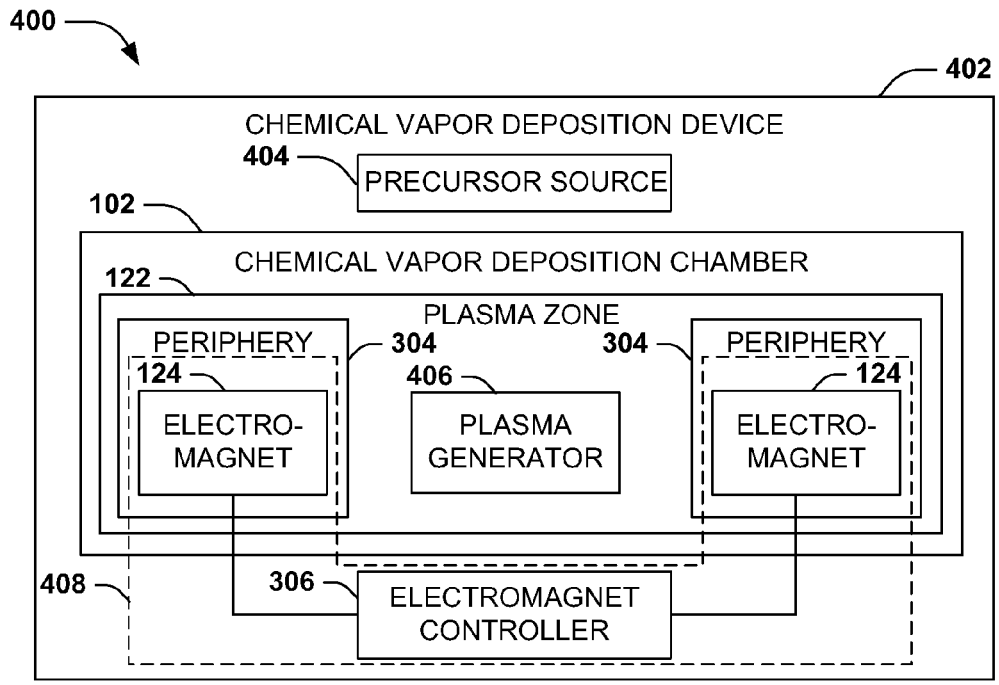
FIG. 4 is an exemplary CVD device including a plasma control device providing plasma control in accordance with the techniques presented herein.

In view of these observations, FIG. 4 presents a component block diagram 400 schematically illustrating an embodiment of the techniques presented herein. This component block diagram 400 illustrates a CVD device 402 comprising precursor source 404 (such as a gas box 106 storing the precursor 108) that is connectable with a CVD chamber 102 to inject the precursor 108. The CVD chamber 102 includes a plasma generator 406 configured to generate a plasma 128 in a plasma zone 122 of the CVD chamber 102. The CVD device 402 also comprises a plasma control device 408, comprising at least one electromagnet 302 positioned in a periphery 304 of the plasma zone 122, and an electromagnet controller 306 configured to provide power controllably to the at least one electromagnet 302 (such as within a power range of approximately 500 to 4,000 watts). The CVD device 402 is therefore equipped to generate a plasma 128 in the plasma zone 122, and a magnetic field 308 that distributes the plasma 128 throughout the plasma zone 122 to achieve more uniform exposure of the substrate 104 to the plasma 128 and tighter process control of the deposition film formed thereupon.

Figure 5:
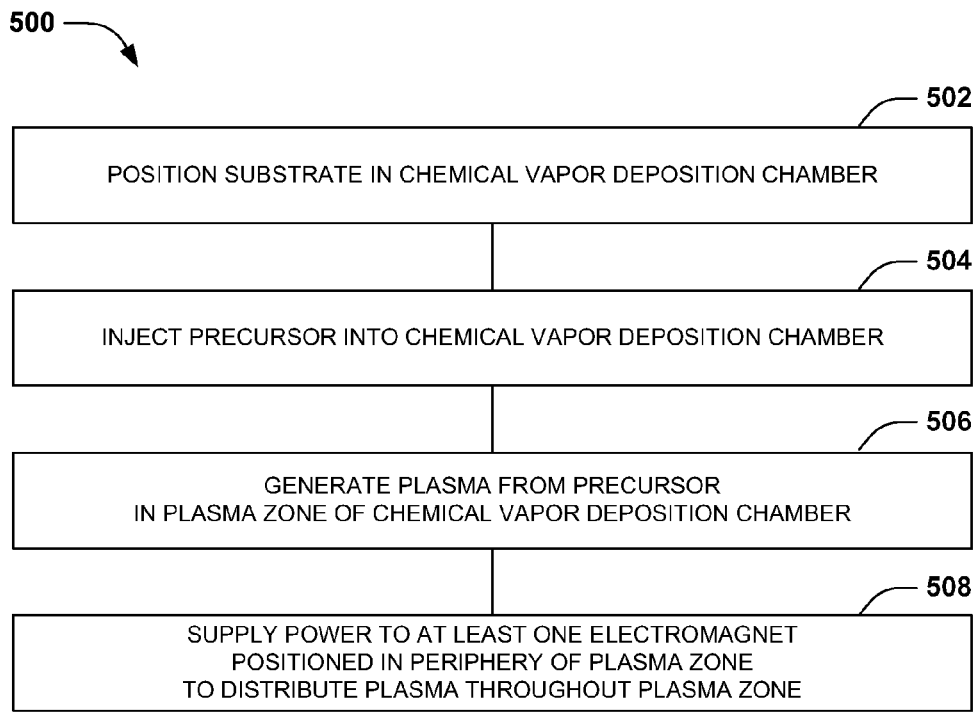
FIG. 5 is a flow diagram illustrating a technique for exposing a substrate to a plasma within a CVD device.

FIG. 5 presents an illustration of a flow diagram providing an exemplary method 500 of exposing a substrate 104 to a plasma 128 in a CVD chamber 102. The exemplary method 500 involves positioning 502 the substrate 104 in the CVD chamber 102, and injecting 504 a precursor 108 into a plasma zone within the CVD chamber 102. The exemplary method 500 also involves generating 506 a plasma 128 from the precursor 108 in the plasma zone 122 of the CVD chamber 102, such as with a set of electrodes 124 positioned within the plasma zone 122, or a source of microwave radiation. The exemplary method 500 also involves supplying 508 power to at least one electromagnet 302 positioned in a periphery 304 of the plasma zone 122 to distribute the plasma 128 throughout the plasma zone 122. By forming and distributing the plasma 128 in this manner, the exemplary method 500 facilitates chemical position of a film on the surface of the substrate 104 with consistent thickness and tight process control.

Figure 6:
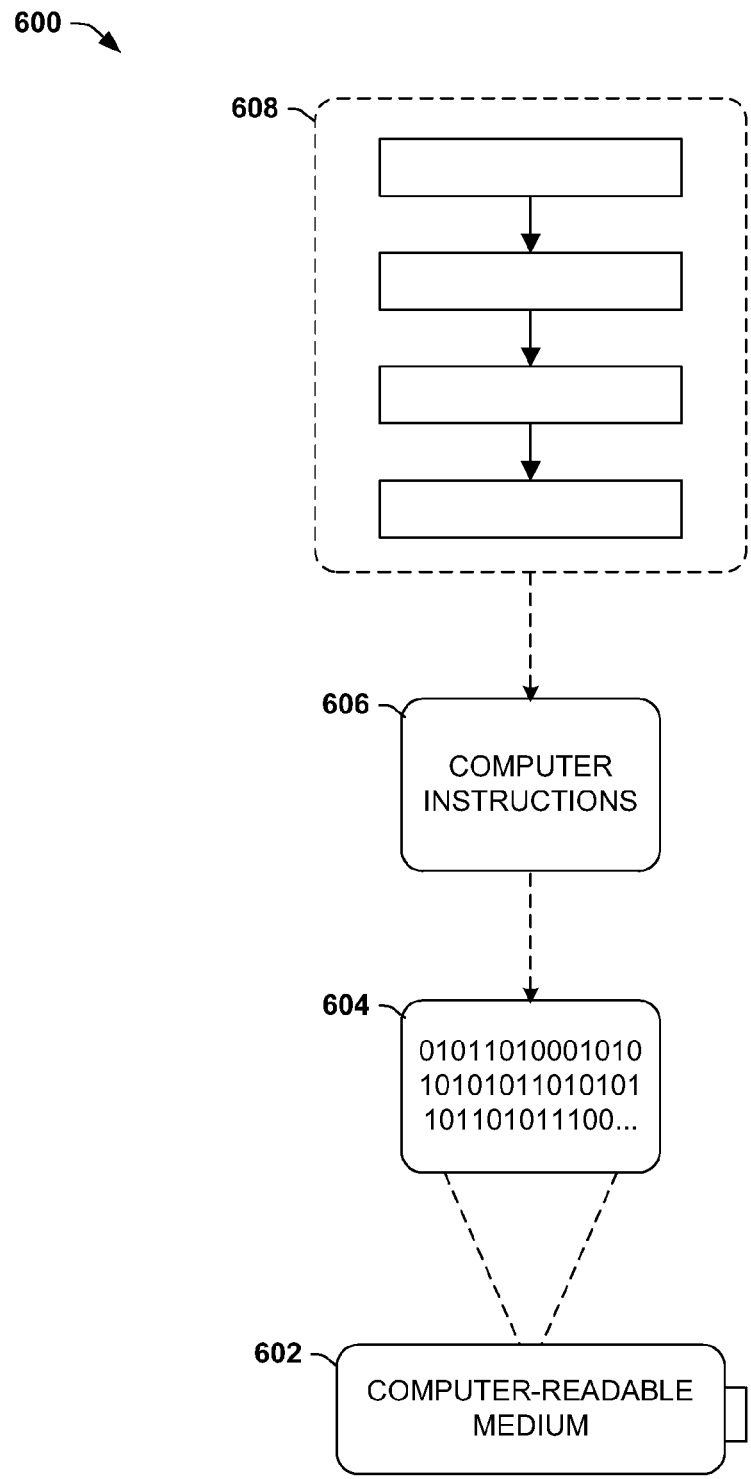
FIG. 6 is an illustration of an exemplary computer-readable medium usable to achieve the techniques presented herein.

At least a portion of the exemplary method 500 of FIG. 5 is performable on a device, including a computer having a processor and storing instructions that, when executed on the processor, cause the device to perform at least a portion of the exemplary method 500. The exemplary method 500. FIG. 6 presents an illustration of an exemplary scenario 600 featuring a computer-readable medium comprising processor-executable instructions configured to implement one or more of the techniques presented herein. The computer-readable device in the exemplary scenario 600 of FIG. 6 comprises a computer-readable medium 602, such as a solid-state memory storage device, on which are encoded a set of computer-readable data 604. Other forms of computer-readable media that are also capable of storing such computer-readable data include a platter of a hard disk drive, a magnetic or optical disc. This computer-readable data 604, such as binary data comprising a plurality of zeroes and ones, in turn comprises a set of computer instructions 606 configured to operate according to one or more of the principles set forth herein. In an embodiment, the processor-executable computer instructions 606 are configured to perform at least a portion of a method, such as at least some of the exemplary method 500 of FIG. 5. Many such computer-readable media are devised by those of ordinary skill in the art that are configured to operate in accordance with the techniques presented herein.

A first set of additional variations that are compatible with the techniques provided herein involves the deployment of the electromagnets 302 within the CVD chamber 102. As a first variation, many types of electromagnet material are suitable for the formation of electromagnets 302 for use within a CVD chamber 102, including iron, cobalt, and nickel.

Figure 7:
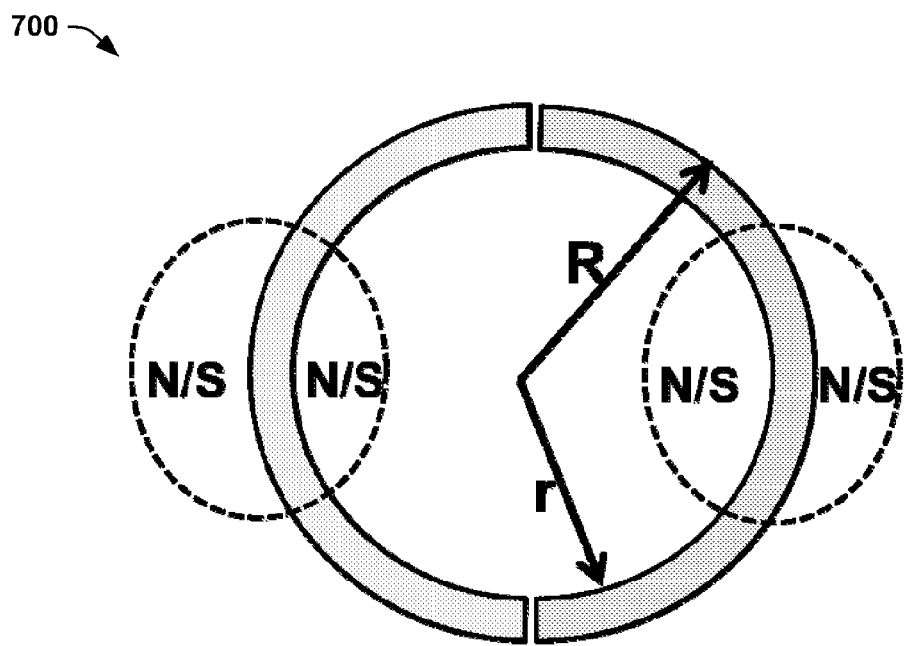
FIG. 7 is an illustration of an exemplary first arrangement and operation of electromagnets in a CVD device.

As a second variation, the positions of the electromagnets 302 are selectable from various configurations in order to create various types of magnetic fields 308. FIG. 7 illustrates a first exemplary configuration involves positioning the electromagnets 302 in electromagnet pairs, comprising a first electromagnet 302 positioned within the periphery 304 of the plasma zone 122 at a first electromagnet position, and a second electromagnet 302 positioned in the periphery 304 of the plasma zone 122 at a second electromagnet position that is approximately opposite the first electromagnet position of the first electromagnet 302, as depicted by a comparatively consistent radius with respect to the inner (r) and outer (R) distances of the electromagnets 302 with respect to the center of the plasma zone 122. Applying approximately equivalent power to the electromagnets 302 of the electromagnet pair, resulting in an approximately equivalent polarity and field strength, enables the generation of a magnetic field 308 that is approximately symmetric over the plasma zone 122. As a second exemplary configuration, a set of at least three electromagnets 302 are distributed radially around the plasma zone 122 at regular and consistent intervals, enabling the generation of an approximately radially symmetric magnetic field over the plasma zone 122.

Figure 8:
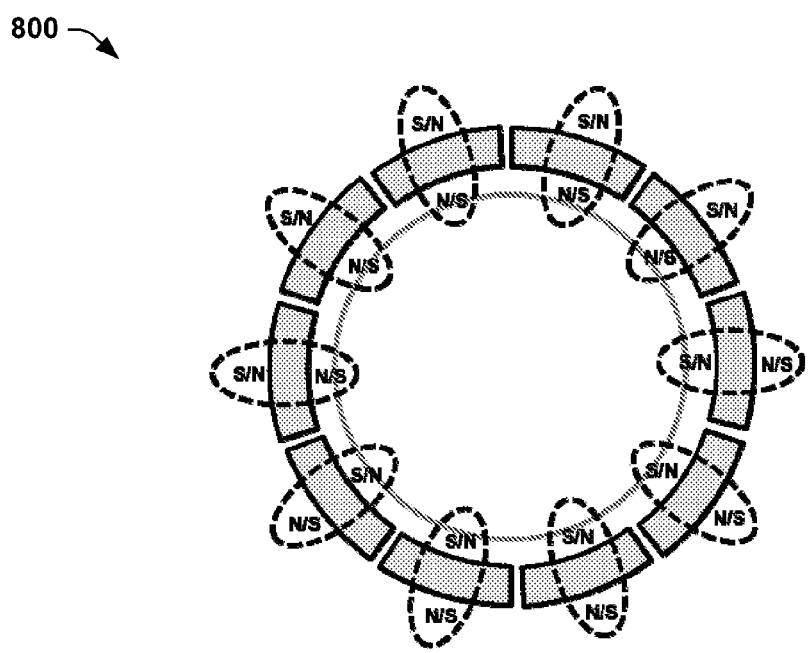
FIG. 8 is an illustration of an exemplary second arrangement and operation of electromagnets in a CVD device.

As a third variation, for a particular electromagnet configuration, the provision of power from an electromagnet controller 306 to the electromagnets 302 is variable to create many types of magnetic fields 308 that affect the distribution of plasma 128 throughout the plasma zone 122 in various ways. As a first example, the electrodes are capable of generating magnetic fields 308 that together adjust the plasma distribution of the plasma 128 in a selected region of the plasma zone 122, such as over a particular portion of the substrate 104 where thicker or thinner deposition is desirable. As a second example, in some configurations, respective electromagnets 302 are controllable by the electromagnet controller 306 to induce a directed flow of the plasma 128 generated in the plasma zone 122. In the exemplary scenario 800 of FIG. 8, the electromagnets 302 on one side of the plasma zone 122 are powered to generate a north/south magnetic field 308, while the electromagnets 302 on the opposite side of the plasma zone 122 are powered to generate a south/north magnetic field 308. A charged plasma 128 created therebetween is attracted by the magnetic fields 308 of one set of electromagnets 302 and repelled by the other magnetic fields 308 of the other set of electromagnets 302, and thus flows in a specific direction.

As a third example, in some configurations, the electromagnet controller 306 is operable to provide power to the electromagnets 302 at a variety of available power settings, and a selected power setting results in an alteration of the magnetic field 308 generated by the at least one electromagnet 302 (including the polarity and the field strength of the magnetic field 308). Additionally, in some configurations, a selected power setting is applied to all of the electromagnets 302, while in other configurations, a first selected power setting is applied to a first electromagnet 302, while, concurrently, a second selected power setting that is different from the first selected power setting is applied to a second electromagnet 302. In some configurations at least one power setting comprises an unpowered setting that withholds power from at least one electromagnet 302. In some configurations, a first available power setting induces, upon selection, a north/south polarity in a selected electromagnet 302, while a second available power setting induces, upon selection, a south/north polarity in the selected electromagnet 302.

In view of these observations, an embodiment of the techniques provided herein involves a chemical vapor deposition (CVD) chamber comprising at least one electromagnet positioned within a periphery of a plasma zone within the CVD chamber, and an electromagnet controller configured to provide power controllably to the at least one electromagnet.

In further view of these observations, an embodiment of the techniques provided herein involves a chemical vapor deposition (CVD) device, comprising a CVD chamber including a plasma zone; a precursor source connectable with the CVD chamber and storing a precursor; a plasma generator configured to generate a plasma from the precursor in the plasma zone; at least one electromagnet positioned within a periphery of the plasma zone; and an electromagnet controller configured to provide power controllably to the at least one electromagnet.

In still further view of these observations, an embodiment of the techniques provided herein involves a method of exposing a substrate to a plasma in a chemical vapor deposition (CVD) chamber, comprising: positioning the substrate in the CVD chamber; injecting a precursor into the CVD chamber; generating a plasma from the precursor in a plasma zone of the CVD chamber; and supplying power to at least one electromagnet positioned in a periphery of the plasma zone to distribute the plasma throughout the plasma zone.

Although the subject matter has been described in language specific to structural features and/or methodological acts, it is to be understood that the subject matter of the appended claims is not necessarily limited to the specific features or acts described above. Rather, the specific features and acts described above are disclosed as example forms of implementing the claims.

Various operations of embodiments are provided herein. The order in which some or all of the operations are described should not be construed as to imply that these operations are necessarily order dependent. Alternative ordering will be appreciated by one skilled in the art having the benefit of this description. Further, it will be understood that not all operations are necessarily present in each embodiment provided herein.

It will be appreciated that layers, features, elements, etc. depicted herein are illustrated with particular dimensions relative to one another, such as structural dimensions and/or orientations, for example, for purposes of simplicity and ease of understanding and that actual dimensions of the same differ substantially from that illustrated herein, in some embodiments. Additionally, a variety of techniques exist for forming the layers, features, elements, etc. mentioned herein, such as implanting techniques, doping techniques, spin-on techniques, sputtering techniques such as magnetron or ion beam sputtering, growth techniques, such as thermal growth and/or deposition techniques such as CVD, for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used in either the detailed description or the claims, such terms are intended to be inclusive in a manner similar to the term "comprising".

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims.

What is claimed is:

1. A plasma control device, comprising:
   an injection assembly through which precursor is injected, the injection assembly comprising:
      an annular pumping liner surrounding a shower head and having a set of liner apertures penetrating an outer surface of the annular pumping liner through which the precursor is emitted into a plasma zone of a chemical vapor deposition (CVD) chamber in which the precursor is converted to plasma;
   a first electromagnet within a periphery of the plasma zone;
   a second electromagnet within the periphery of the plasma zone, wherein:
      the first electromagnet and the second electromagnet are positioned between the injection assembly and a substrate, and
      the first electromagnet and the second electromagnet are not laterally co-planar with the substrate; and
   an electromagnet controller configured to adjust power to the first electromagnet and the second electromagnet based upon a specified distribution of the plasma relative to the substrate.

2. The plasma control device of claim 1, wherein the first electromagnet comprises at least one of iron (Fe); cobalt (Co); or nickel (Ni).

3. The plasma control device of claim 1, wherein:
   the first electromagnet is positioned within the periphery of the plasma zone at a first electromagnet position; and
   the second electromagnet is positioned within the periphery of the plasma zone at a second electromagnet position that is approximately opposite the first electromagnet position.

4. The plasma control device of claim 1, wherein the first electromagnet and the second electromagnet are positioned within the periphery of the plasma zone to generate an approximately radially symmetric magnetic field.

5. The plasma control device of claim 1, wherein the first electromagnet and the second electromagnet are positioned within the periphery of the plasma zone to adjust a plasma distribution of the plasma in a selected region of the plasma zone.

6. The plasma control device of claim 1, wherein the first electromagnet and the second electromagnet are positioned within the periphery of the plasma zone to induce a directed flow of the plasma generated in the plasma zone.

7. The plasma control device of claim 1, wherein the electromagnet controller is operable to apply a selected power setting among at least two available power settings to the first electromagnet to alter a magnetic field generated by the first electromagnet.

8. The plasma control device of claim 1, wherein the electromagnet controller is operable to apply concurrently:
   a first selected power setting to the first electromagnet; and
   a second selected power setting to the second electromagnet that is different from the first selected power setting.

9. The plasma control device of claim 7, wherein one of the at least two available power settings comprises an unpowered setting.

10. The plasma control device of claim 7, wherein:
    a first available power setting of the at least two available power settings induces, upon selection, a north/south polarity in the first electromagnet; and
    a second available power setting of the at least two available power settings induces, upon selection, a south/north polarity in the first electromagnet.

11. A chemical vapor deposition (CVD) device, comprising:
    a CVD chamber comprising:
       a plasma zone, and
       an injection assembly, comprising:
          an annular pumping liner surrounding a shower head and having a set of liner apertures penetrating an outer surface of the annular pumping liner through which a precursor is emitted into the plasma zone;
    a precursor source connectable with the injection assembly and storing the precursor;
    a plasma generator configured to generate a plasma from the precursor in the plasma zone;
    at least one electromagnet positioned at a fixed location within a periphery of the plasma zone; and
    an electromagnet controller configured to adjust power to the at least one electromagnet based upon a specified distribution of the plasma relative to a substrate.

12. The CVD device of claim 11, wherein the at least one electromagnet comprises a set of at least three electromagnets positioned radially around the plasma zone.

13. The CVD device of claim 11, wherein the at least one electromagnet comprises at least one electromagnet pair comprising:
    a first electromagnet positioned within the periphery of the plasma zone at a first electromagnet position; and
    a second electromagnet positioned within the periphery of the plasma zone at a second electromagnet position that is approximately opposite the first electromagnet position.

14. The CVD device of claim 13, wherein:
    the first electromagnet and the second electromagnet are positioned between the injection assembly and the substrate, and
    the first electromagnet and the second electromagnet are not co-planar with the substrate.

15. The CVD device of claim 11, wherein the electromagnet controller is operable to apply a selected power setting among at least two available power settings to the at least one electromagnet to alter an magnetic field generated by the at least one electromagnet.

16. The CVD device of claim 11, wherein the electromagnet controller is operable to apply concurrently:
    a first selected power setting to a first electromagnet; and
    a second selected power setting to a second electromagnet that is different from the first selected power setting.

17. The CVD device of claim 15, wherein:
a first available power setting of the at least two available power settings induces, upon selection, a north/south polarity in the at least one electromagnet; and
a second available power setting of the at least two available power settings induces, upon selection, a south/north polarity in the at least one electromagnet.

18. A chemical vapor deposition (CVD) device for applying plasma during formation of a semiconductor device on a substrate, comprising:
a CVD chamber comprising:
a plasma zone, and
an injection assembly, comprising:
an annular pumping liner surrounding a shower head and having a set of liner apertures penetrating an outer surface of the annular pumping liner through which a precursor is emitted into the plasma zone;
a precursor source connectable with the CVD chamber and storing the precursor;
a plasma generator configured to generate the plasma from the precursor; and
an electromagnet positioned at a fixed location and configured to adjust an electromagnetic field based upon a specified distribution of the plasma relative to the substrate to steer the plasma relative to the substrate, wherein a bottom surface of the electromagnet is above a top surface of the substrate.

19. The CVD device of claim 18, comprising an electromagnet controller configured to provide power to the electromagnet.

20. The CVD device of claim 18, comprising:
a second electromagnet configured to steer the plasma relative to the substrate; and
an electromagnet controller configured to adjust power to the electromagnet and the second electromagnet based upon the specified distribution of the plasma relative to the substrate.

* * * * *